United States Patent
Ye et al.

(10) Patent No.: US 9,012,328 B2
(45) Date of Patent: Apr. 21, 2015

(54) CARBON ADDITION FOR LOW RESISTIVITY IN SITU DOPED SILICON EPITAXY

(75) Inventors: Zhiyuan Ye, San Jose, CA (US); Xuebin Li, Santa Clara, CA (US); Saurabh Chopra, Santa Clara, CA (US); Yihwan Kim, San Jose, CA (US)

(73) Assignee: Applied Materials, Inc., Santa Clara ( * ) Notice: Subject to any disclaimer, the term of this patent is extended or adjusted under 35 U.S.C. 154(b) by 124 days.

(21) Appl. No.: 13/193,566

(22) Filed: Jul. 28, 2011

(65) Prior Publication Data

US 2012/0193623 A1   Aug. 2, 2012

Related U.S. Application Data

(60) Provisional application No. 61/437,436, filed on Jan. 28, 2011.

(51) Int. Cl.
| | |
|---|---|
| *H01L 21/311* | (2006.01) |
| *H01L 21/02* | (2006.01) |
| *H01L 29/66* | (2006.01) |
| *H01L 29/78* | (2006.01) |
| *H01L 21/8238* | (2006.01) |

(52) U.S. Cl.
CPC ...... *H01L 21/02532* (2013.01); *H01L 21/0245* (2013.01); *H01L 21/02529* (2013.01); *H01L 21/02573* (2013.01); *H01L 21/02664* (2013.01); *H01L 21/823814* (2013.01); *H01L 29/66628* (2013.01); *H01L 29/66636* (2013.01); *H01L 29/7834* (2013.01)

(58) Field of Classification Search
CPC ............ H01L 21/02532; H01L 21/02573; H01L 21/02576; H01L 29/66575; H01L 29/66636; H01L 29/66878

USPC ............ 438/197, 299, 301, 694, 753, 761; 257/288, E21.431
See application file for complete search history.

(56) References Cited

U.S. PATENT DOCUMENTS

| | | | |
|---|---|---|---|
| 6,323,525 B1 * | 11/2001 | Noguchi et al. | 257/385 |
| 6,576,535 B2 | 6/2003 | Drobny et al. | |
| 6,916,698 B2 | 7/2005 | Mocuta et al. | |

(Continued)

OTHER PUBLICATIONS

PCT Search Report and Written Opinion dated May 23, 2012 for International Application No. PCT/US2011/045624.

*Primary Examiner* — Jay C Kim
(74) *Attorney, Agent, or Firm* — Patterson & Sheridan, LLP

(57) ABSTRACT

Embodiments of the present invention generally relate to methods of forming epitaxial layers and devices having epitaxial layers. The methods generally include forming a first epitaxial layer including phosphorus and carbon on a substrate, and then forming a second epitaxial layer including phosphorus and carbon on the first epitaxial layer. The second epitaxial layer has a lower phosphorus concentration than the first epitaxial layer, which allows for selective etching of the second epitaxial layer and undesired amorphous silicon or polysilicon deposited during the depositions. The substrate is then exposed to an etchant to remove the second epitaxial layer and undesired amorphous silicon or polysilicon. The carbon present in the first and second epitaxial layers reduces phosphorus diffusion, which allows for higher phosphorus doping concentrations. The increased phosphorus concentrations reduce the resistivity of the final device. The devices include epitaxial layers having a resistivity of less than about 0.381 milliohm-centimeters.

15 Claims, 2 Drawing Sheets

(56) References Cited

U.S. PATENT DOCUMENTS

| | | |
|---|---|---|
| 7,166,528 B2 | 1/2007 | Kim et al. |
| 7,402,872 B2 | 7/2008 | Murthy et al. |
| 7,517,772 B2 * | 4/2009 | Rachmady et al. ........... 438/478 |
| 7,960,236 B2 | 6/2011 | Chopra et al. |
| 8,029,620 B2 | 10/2011 | Kim et al. |
| 2005/0279997 A1 | 12/2005 | Shin et al. |
| 2007/0023847 A1 * | 2/2007 | Rhee et al. .................... 257/408 |
| 2007/0287272 A1 | 12/2007 | Bauer et al. |
| 2012/0258582 A1 * | 10/2012 | Seino et al. ................... 438/478 |

* cited by examiner

CARBON ADDITION FOR LOW RESISTIVITY IN SITU DOPED SILICON EPITAXY

CROSS-REFERENCE TO RELATED APPLICATIONS

This application claims benefit of U.S. Provisional Patent Application Ser. No. 61/437,436, filed Jan. 28, 2011, which is herein incorporated by reference.

BACKGROUND OF THE INVENTION

1. Field of the Invention

Embodiments of the invention generally relate to the field of semiconductor manufacturing processes and devices, more particularly, to methods of depositing silicon-containing films for forming semiconductor devices.

2. Description of the Related Art

As smaller devices are manufactured, ultra shallow source/drain junctions are becoming more challenging to produce. Generally, sub-100 nm CMOS (complementary metal-oxide semiconductor) devices require a junction depth to be less than 30 nanometers. However, ultra shallow source/drain junctions inevitably result in increased series resistance. One approach for reducing series resistance includes heavily doping the epitaxial films used in forming the device. However, heavily doped films can degrade film quality due to dopant surface poisoning and increased film roughness. Additionally, high dopant levels achieved during cyclical deposition processes may result surface segregation during etching and purge steps.

Therefore, there is a need for forming high quality epitaxial films having reduced resistivity.

SUMMARY OF THE INVENTION

Embodiments of the present invention generally relate to methods of forming epitaxial layers and devices having epitaxial layers. The methods generally include forming a first epitaxial layer including phosphorus and carbon on a substrate, and then forming a second epitaxial layer including phosphorus and carbon on the first epitaxial layer. The second epitaxial layer has a lower phosphorus concentration than the first epitaxial layer, which allows for selective etching of the second epitaxial layer and undesired amorphous silicon or polysilicon deposited during the depositions. The substrate is then exposed to an etchant to remove the second epitaxial layer and undesired amorphous silicon or polysilicon. The carbon present in the first and second epitaxial layers reduces phosphorus diffusion, which allows for higher phosphorus doping concentrations. The increased phosphorus concentrations reduce the resistivity of the final device. The devices include epitaxial layers having a resistivity of less than about 0.381 milliohm-centimeters.

In one embodiment, a method of forming a layer on a substrate is provided. The method includes forming a first epitaxial layer and a first silicon-containing layer on the substrate. The first epitaxial layer and the first silicon-containing layer comprise carbon and a first concentration of phosphorus. The method also includes forming a second epitaxial layer over the first epitaxial layer and forming a second silicon-containing layer over the first silicon-containing layer. The second epitaxial layer and the second silicon-containing layer are formed simultaneously. Each of the second epitaxial layer and the second silicon-containing layer comprise carbon and a second concentration of phosphorus less than the first concentration of phosphorus. The substrate is then exposed to an etchant to selectively remove the second epitaxial layer, the first silicon-containing layer, and the second silicon-containing layer.

In another embodiment, a method of forming a layer on a substrate comprises forming a first epitaxial layer and a first silicon-containing layer on the substrate. The first epitaxial layer and the first silicon-containing layer comprise carbon and a phosphorus concentration of about $1 \times 10^{19}$ atoms per cubic centimeter to about $2.5 \times 10^{21}$ atoms per cubic centimeter. A second epitaxial layer is then formed over the first epitaxial layer and a second silicon-containing layer is then formed over the first silicon-containing layer. The second epitaxial layer and the second silicon-containing layer are formed simultaneously, and each of the second epitaxial layer and the second silicon-containing layer comprise carbon and a second concentration of phosphorus less than the first phosphorus concentration. The substrate is then exposed to an etchant to selectively remove the second epitaxial layer, the first silicon-containing layer, and the second silicon-containing layer.

In another embodiment, a device is provided. The device comprises a monocrystalline silicon substrate and an epitaxially-grown silicon film comprising phosphorus and carbon. The phosphorus is present within the epitaxially-grown silicon film in a concentration of about $5 \times 10^{20}$ atoms per cubic centimeter or greater. The carbon is present within the epitaxially-grown silicon film in a concentration within a range from about 0.1 atomic percent to about 0.3 atomic percent. The epitaxially-grown silicon film has a resistivity of less than about 0.381 mΩ-cm.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods of forming epitaxial layers and devices having epitaxial layers. The methods generally include forming a first epitaxial layer including phosphorus and carbon on a substrate, and then forming a second epitaxial layer including phosphorus and carbon on the first epitaxial layer. The second epitaxial layer has a lower phosphorus concentration than the first epitaxial layer, which allows for selective etching of the second epitaxial layer and undesired amorphous silicon or polysilicon deposited during the depositions. The substrate is then exposed to an etchant to remove the second epitaxial layer and undesired amorphous silicon or polysilicon. The carbon present in the first and second epitaxial layers reduces phosphorus diffusion, which allows for higher phosphorus doping concentrations. The increased phosphorus concentrations reduce the resistivity of the final device. The devices include epitaxial layers having a resistivity of less than about 0.381 milliohm-centimeters.

Embodiments of the present invention may be practiced in the CENTURA® RP Epi chamber available from Applied Materials, Inc., of Santa Clara, Calif. It is contemplated that other chambers, including those available from other manufacturers, may be used to practice embodiments of the invention.

Figure 1A:
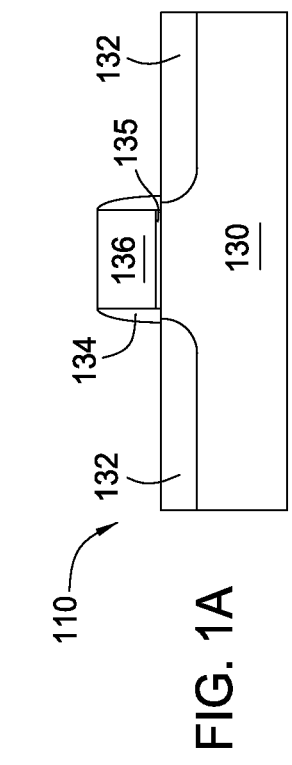
FIGS. 1A-1E are schematic illustrations of a device during an epitaxial formation process.

FIGS. 1A-1E are schematic illustrations of a device 110 during an epitaxial formation process. FIG. 1A depicts source/drain features 132 formed by implanting ions into the surface of a substrate 130. The substrate 130 is generally a monocrystalline silicon substrate. The source/drain features 132 may include an n-type dopant, such as phosphorus, while the substrate 130 includes p-type dopant. Alternatively, the source/drain features 132 may contain a p-type dopant while the substrate 130 contains an n-type dopant. The segments of source/drain features 132 are bridged by a gate 136 formed on a gate oxide layer 135 and off-set layer 134. The gate oxide layer 135 is composed of silicon dioxide, but may alternatively be formed from silicon oxynitride or hafnium oxide. The gate 136 is formed from amorphous silicon, but may also be formed from polysilicon. The off-set layer 134 is formed from silicon nitride.

Figure 1B:
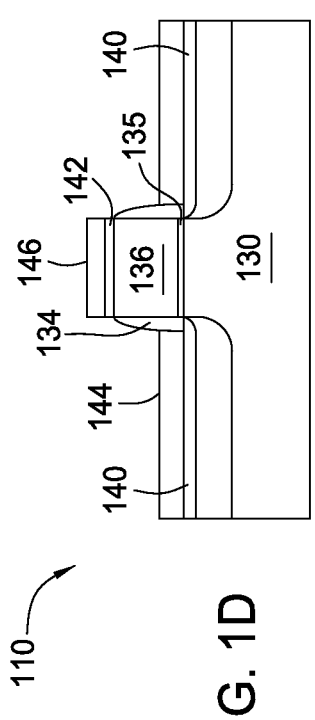
Figure 1C:
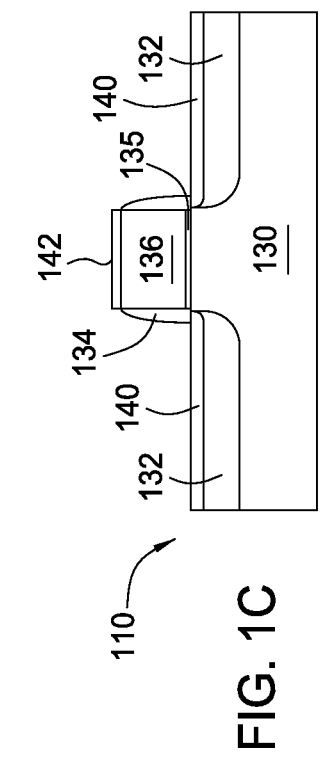

As shown in FIG. 1B, a portion of the source/drain features 132 is etched and wet-cleaned to produce a recess 138. A portion of the gate 136 may also be etched, or optionally a hardmask may be deposited prior to etching to avoid gate material removal. FIG. 1C illustrates a first epitaxial layer 140 formed on the device 110. The first epitaxial layer 140 is deposited on the source/drain features 132 of the device 110. The first epitaxial layer 140 adheres to and grows from the crystal lattice of the underlying layers (e.g., the source/drain features 132) and maintains this arrangement as the first epitaxial layer increases in thickness. Likewise, a first silicon-containing layer 142 is also grown on the gate 136 at the same time that the first epitaxial layer 140 is formed. The first silicon-containing layer 142 may be polycrystalline or amorphous silicon, depending upon the material of the gate 136.

The first epitaxial layer 140 and the first silicon-containing layer 142 are doped with one or more dopants, such as phosphorus and carbon, during deposition. When using phosphorus as a dopant, the first epitaxial layer 140 and the first silicon-containing layer 142 are doped to a phosphorus concentration of about $1\times10^{19}$ atoms/cm$^3$ to about $2.5\times10^{21}$ atoms/cm$^3$. For example, the first epitaxial layer 140 and the first silicon-containing layer 142 may have a phosphorus concentration of about $5\times10^{20}$ atoms/cm$^3$ or greater. The first epitaxial layer 140 and the first silicon-containing layer 142 may have a carbon concentration less than about 0.5 atomic percent, for example, between about 0.1 atomic percent and about 0.3 atomic percent. When the first epitaxial layer 140 is doped to a carbon concentration of about 0.5 atomic percent or greater, the resistance of the device 110 increases due to the competition for activation between carbon atoms and phosphorus atoms.

The inclusion of higher concentrations of phosphorus, for example, greater than about $5\times10^{20}$ atoms/cm$^3$, reduces electrical resistance within the device 110. However, high concentrations of dopants such as phosphorus degrade epitaxial film quality by increasing film haziness, or by poisoning the substrate surface (e.g., reducing or preventing epitaxial growth on the surface) due to the diffusion of the dopant atoms during processing. Furthermore, during etching steps commonly associated with epitaxial growth, phosphorus atoms which migrate to the surface of the film are etched away. Since some of the phosphorus dopant atoms are removed during the etching step, the phosphorus dopant concentration within the film is reduced, and the resistivity of the film is increased.

However, the addition of carbon to the film mitigates the problems commonly associated with higher phosphorus dopant concentrations. The inclusion of small amounts of carbon (e.g., generally less than about 0.5 atomic percent) into the deposited films reduces the diffusion of phosphorus or other dopants within the deposited film. Therefore, substrate surface poisoning due to dopant diffusion, as well as dopant concentration reduction during etching steps, is reduced. This results in a film having a higher dopant concentration, and thus, reduced resistivity.

Figure 1D:
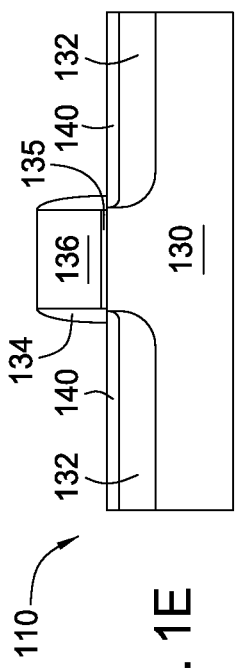

FIG. 1D illustrates the device 110 subsequent to the deposition of a second epitaxial layer 144 and a second silicon-containing layer 146 on the upper surfaces of the first epitaxial layer 140 and the first silicon-containing layer 142, respectively. The second epitaxial layer 144 and the second silicon-containing layer 146 also contain phosphorus and carbon. The second epitaxial layer 144 and the second silicon-containing layer 146 generally have the same concentration of carbon as the first epitaxial layer 140 and the first silicon-containing layer 142. However, the second epitaxial layer 144 and the second silicon-containing layer 146 have a lower phosphorus concentration than the first epitaxial layer 140 and the first silicon-containing layer 142. For example, the second epitaxial layer 144 and the second silicon-containing layer 146 may have a phosphorus concentration less than about $5\times10^{20}$ atoms/cm$^3$, such as about $1\times10^{20}$ atoms/cm$^3$ to about $3\times10^{20}$ atoms/cm$^3$.

Embodiments of the invention utilize multiple layers having different dopant concentrations in order to promote selective etching. Generally, epitaxially-grown silicon etches at a different rate than polysilicon or amorphous silicon. Thus, undesirable amorphous silicon or polysilicon can be removed from a device by controlling etching chemistry to remove the amorphous or polysilicon at a faster rate than the epitaxially-grown silicon; thereby leaving the epitaxially-grown silicon on the substrate. However, deposited layers having high phosphorus concentrations, such as about $5\times10^{20}$ atoms/cm$^3$ or greater (e.g., to the first epitaxial layer 140 and the first silicon-containing layer 142), experience reduced selectivity with respect to the etching rates of epitaxially-grown silicon films as compared to amorphous or polysilicon films. Thus, the first epitaxial layer 140 (having a monocrystalline silicon lattice) and the first silicon-containing layer 142 (amorphous silicon or polysilicon) would be removed at approximately the same rate when exposed to an etchant due to the relatively high phosphorus concentration present in each of the layers 140 and 142. Generally, only removal of the amorphous silicon or polysilicon is desired.

In contrast, deposited layers having a relatively lower phosphorus concentration, such as about $3\times10^{20}$ atoms/cm$^3$ or less (e.g., the second epitaxial layer 144 and the second silicon-containing layer 146), maintain selectivity when exposed to an etchant. During etching, the second epitaxial layer 144 and the second silicon-containing layer 146, being on the exposed top surface of the device 110, are initially subjected to the etching gas. The second silicon-containing layer 146 is removed at a greater rate than the second epitaxial layer 144 due to the selectivity of epitaxial silicon as compared to amorphous silicon or polysilicon when using lower dopant concentrations (e.g., less than about $3\times10^{20}$ atoms/ cm³). Because of this selectivity, the second silicon-containing layer 146 is removed, exposing the first silicon-containing layer 142 prior to removal of the second epitaxial layer 144. As the etching process is continued to remove the first silicon-containing layer 142, the second epitaxial layer 144 is also continually etched. Desirably, the second epitaxial layer 144 is removed in approximately the same amount of time as is required to remove both the second silicon-containing layer 146 and the first silicon-containing layer 142. Therefore, only the first epitaxial layer 140 is left on the substrate surface. Thus, the use of two layers of varying phosphorus concentrations assists in the selective removal of amorphous silicon and polysilicon when utilizing increased dopant concentrations.

Figure 1E:
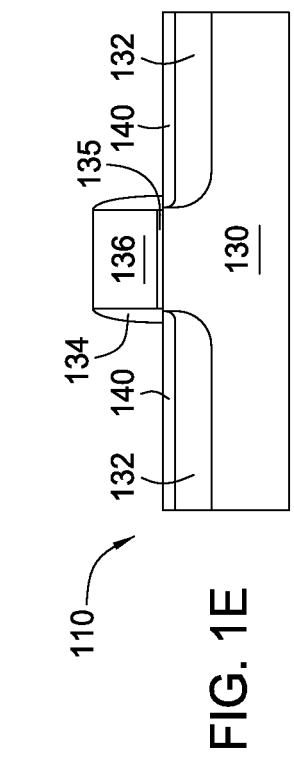

FIG. 1E illustrates the device 110 after the first silicon-containing layer 142, the second silicon containing layer 146, and the second epitaxial layer 144 have been selectively etched from the surface of the substrate 130. The first epitaxial layer 140, which has a relatively high phosphorus concentration, remains on the surface of the substrate 130.

Figure 2:
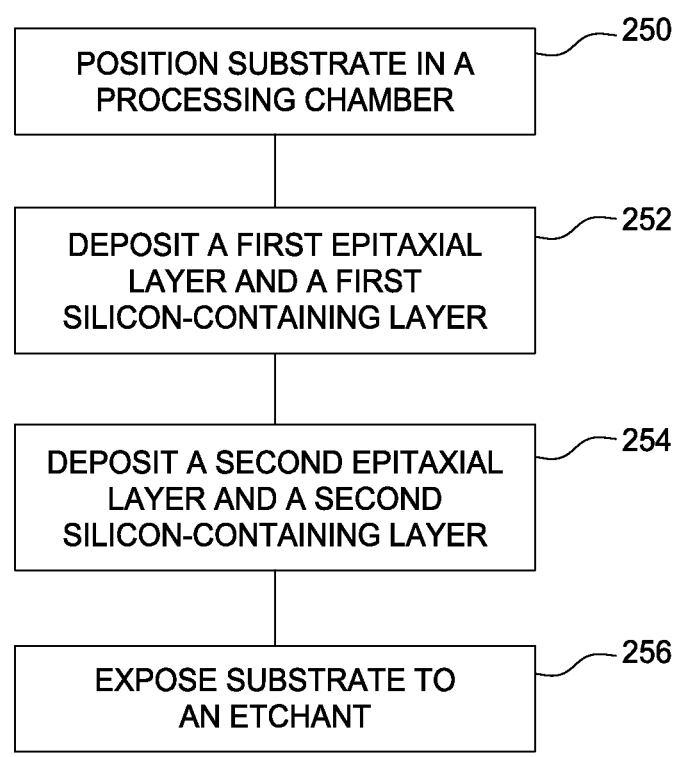
FIG. 2 is a flow diagram illustrating a method of forming an epitaxial layer on a device.

FIG. 2 is a flow diagram illustrating a method of forming an epitaxial layer on a device. In step 250, a substrate is positioned within a process chamber, such as an epitaxial growth chamber, and the substrate is heated to a predetermined temperature. The predetermined temperature is generally within a range from about 500° C. to about 900° C., such as about 500° C. to about 750° C.

In step 252, a first epitaxial layer and a first silicon-containing layer are deposited on a surface of the substrate. During the deposition, a silicon precursor (e.g., silane) is flown concurrently into the process chamber with a phosphorus-containing gas (e.g., phosphine), and a carbon-containing gas (e.g., methylsilane, dimethylsilane, or trimethylsilane). Optionally, a carrier gas (e.g., $H_2$ and/or $N_2$) may be flow into the process chamber with any of the silicon precursor, the phosphorus-containing gas, or the carbon-containing gas.

The mixture of reagents is thermally driven to react and deposit the first epitaxial layer and the first silicon-containing layer on the substrate surface. The first epitaxial layer and the first silicon-containing layer are deposited to a thickness within a range from about 10 angstroms to about 1000 angstroms, such as about 20 angstroms to about 200 angstroms. For example, the first epitaxial layer and the first silicon-containing layer may be deposited to a thickness of about 30 angstroms. The flow rate of the silicon precursor is within a range from about 50 sccm to about 200 sccm, while the flow rate of the carrier gas is within a range from about 3 slm to about 30 slm. The flow rate of the phosphorus-containing gas is within a range from about 12 sccm to about 16 sccm. The flow rate of the carbon-containing gas is within a range from about 5 sccm to about 15 sccm. It is contemplated that other silicon, carbon, and phosphorus sources can be used as alternatives or in addition to those listed above.

In step 254, a second epitaxial layer and a second silicon-containing layer are simultaneously deposited on the first epitaxial layer and the first silicon-containing layer. The second epitaxial layer and the second silicon-containing layer are deposited to a thickness within a range from about 10 angstroms to about 2000 angstroms, such as 40 angstroms to about 400 angstroms. For example, the second epitaxial layer and the second silicon-containing layer may be deposited to a thickness of about 50 angstroms. Generally, the second epitaxial layer and the second silicon-containing layer are deposited to a thickness greater than the first epitaxial layer and the first silicon-containing layer. However, it is contemplated that the desired thicknesses of the layers may be adjusted to accommodate differences in etching rates between the layers. Thus, the second epitaxial layer and the second silicon-containing layer may not always have a thickness greater than the first epitaxial layer and the first silicon-containing layer.

The same precursor gases used to deposit the first epitaxial layer and the first silicon-containing layer are also used to deposit the second epitaxial layer and the second silicon-containing layer. Generally, the precursor gases are provided at similar flow rates when depositing the second epitaxial layer and the second silicon-containing layer. However, the flow rate of the phosphorus-containing gas is reduced so that the concentration of phosphorus within the second epitaxial layer and the second silicon-containing layer is less than the phosphorus concentration within the first epitaxial layer and the first silicon-containing layer. During deposition of the second epitaxial layer and the second silicon-containing layer, the flow rate of the phosphorus-containing gas is reduced to within a range of about 2 sccm to about 6 sccm. The second epitaxial layer and the second silicon-containing layer have a lower concentration of phosphorus as compared to the first epitaxial layer and the first silicon-containing layer in order to maintain etching selectivity between the epitaxial layer and amorphous silicon or polysilicon during a subsequent etching step.

In step 256, a substrate is exposed to an etchant to selectively etch the first and second silicon-containing layers, as well as the second epitaxial layer, from the substrate. Thus, only the first epitaxial layer (having a high phosphorus concentration for reduced resistivity) remains on the substrate surface after the etching processing. Suitable etchants include HCl, HF, HBr, $CCl_4$, $Cl_2$, and combinations thereof. The etchant is provided to the processing chamber at a flow rate within a range from about 30 sccm to about 20,000 sccm, depending upon the processing temperature and the etchant used. Optionally, the first epitaxial layer may be slightly over-etched to ensure that the entire second epitaxial layer is removed from the surface of the first epitaxial layer. Presence of the second epitaxial layer, which has a lower phosphorus concentration than the first epitaxial layer, would undesirably increase the resistance of the device if allowed to remain on the substrate.

TABLE 1

| | Haze (parts per million) | Percent Carbon | Thickness (angstroms) | Resistivity (mΩ-cm) | $PH_3$ Flow Rate (sccm) |
|---|---|---|---|---|---|
| Example 1 | 1 | 0.26 | 731 | 0.345 | 16 |
| Example 2 | <1 | 0.55 | 747 | 0.384 | 15 |
| Example 3 | <1 | 0.58 | 902 | 0.381 | 15 |
| Example 4 | <1 | 0.6 | 1081 | 0.389 | 15 |
| Example 5 | >10 | 0 | 541 | 0.386 | 14 |
| Example 6 | >5 | 0 | 432 | 0.385 | 14 |
| Example 7 | >2 | 0 | 495 | 0.389 | 12 |

Table 1 illustrates several examples of the properties of epitaxial films produced according to embodiments described herein. In Example 1, an epitaxial film is produced while providing 16 sccm of phosphine to a processing chamber to deposit a silicon epitaxial film containing phosphorus and carbon. After selective etching, the epitaxial film has a thickness of 731 angstroms. The epitaxial film of Example 1 has a carbon concentration of 0.26 atomic percent, a resistance of 0.345 milliohm-centimeter (mΩ-cm), and haze of about 1 part per million. Thus, using embodiments described herein, epitaxial films having a resistance of 0.345 mΩ-cm or less can be achieved.

In Example 2, an epitaxial film is produced while providing 15 sccm of phosphine to a processing chamber to deposit a silicon epitaxial film containing phosphorus and carbon.

After selective etching, the epitaxial film has a thickness of 747 angstroms. The epitaxial film of Example 2 has a carbon concentration of 0.55 atomic percent, a resistance of 0.384 mΩ-cm, and haze of less than 1 part per million. In Example 3, an epitaxial film is produced while providing 15 sccm of phosphine to a processing chamber to deposit a silicon epitaxial film containing phosphorus and carbon. After selective etching, the epitaxial film has a thickness of 902 angstroms. The epitaxial film of Example 3 has a carbon concentration of 0.58 atomic percent, a resistance of 0.381 mΩ-cm, and haze of less than 1 part per million. Thus, using embodiments described herein, epitaxial films having a resistance of 0.381 mΩ-cm or less can be achieved.

In Example 4, an epitaxial film is produced while providing 15 sccm of phosphine to a processing chamber to deposit a silicon epitaxial film containing phosphorus and carbon. After selective etching, the epitaxial film has a thickness of 1081 angstroms. The epitaxial film of Example 4 has a carbon concentration of 0.6 atomic percent, a resistance of 0.389 mΩ-cm, and haze of about 1 part per million. In Example 5, an epitaxial film is produced while providing 14 sccm of phosphine to a processing chamber to deposit a silicon epitaxial film containing phosphorus. After selective etching, the epitaxial film has a thickness of 541 angstroms. The epitaxial film of Example 5 has a resistance of 0.386 mΩ-cm, and haze of greater than 10 parts per million. It is to be noted that the exclusion of carbon from the epitaxial film increases the haze of the film.

In Example 6, an epitaxial film is produced while providing 14 sccm of phosphine to a processing chamber to deposit a silicon epitaxial film containing phosphorus. After selective etching, the epitaxial film has a thickness of 432 angstroms. The epitaxial film of Example 6 has a resistance of 0.385 mΩ-cm, and haze of greater than 5 parts per million. Thus, even at reduced phosphorus concentrations, epitaxial films which do not include carbon experience relatively greater hazing. In Example 7, an epitaxial film is produced while providing 12 sccm of phosphine to a processing chamber to deposit a silicon epitaxial film containing phosphorus. After selective etching, the epitaxial film has a thickness of 495 angstroms. The epitaxial film of Example 7 has a resistance of 0.389 mΩ-cm, and haze greater than 2 parts per million.

As can be seen in Table 1, the addition of carbon to an epitaxially grown film reduces the haze of the film. The haze of a film is indicative of the planarity or reflectivity of the deposited film, and thus, is also indicative of the quality of the film. A higher value of haze indicates a greater degree of off-axis light scattering produced by the surface texture of the epitaxial layer. Surface roughness indicates a lower quality film, with a haze of about 1 part per million or less being desirable. Generally, high concentrations of dopants such as phosphorus cause film degradation, as shown in Example 5. It is believed that the haze of the film is improved due to carbon addition because the carbon slows the diffusion rate of the dopant within the film. Since carbon addition allows a higher concentration of dopant to be used while maintaining film quality, resistance is reduced. As shown in the column labeled "Resistivity", the inclusion of carbon in the epitaxial film allows a greater concentration of dopant to be used while still maintaining acceptable film haziness. However, as can be seen, the resistance of the film increases when carbon concentrations within the film exceed 0.5 atomic percent. Therefore, a desirable range for carbon concentrations is from about 0.1 atomic percent to about 0.3 atomic percent, and more desirably, about 0.2 atomic percent to about 0.3 atomic percent.

Although embodiments are described herein as utilizing phosphorus as dopant material, it is contemplated that other dopant materials may be used. For example, it is contemplated that arsenic, boron, and germanium, among other materials, may be used as a dopant.

Benefits of the invention include, but are not limited to low resistance, high quality silicon epitaxial films. The incorporation of carbon into deposited films allows for higher dopant concentrations to be utilized by reducing dopant diffusion, thereby resulting in higher quality films (e.g., reduced haze). The higher dopant concentrations result in reduced resistivity in the deposited layers. Selectivity of the highly-doped epitaxial layers is maintained using a multi-layered approach, wherein the multiple layers have varying concentrations of dopant.

While the foregoing is directed to embodiments of the present invention, other and further embodiments of the invention may be devised without departing from the basic scope thereof, and the scope thereof is determined by the claims that follow.

We claim:

1. A method of forming a layer on a substrate, comprising:
    forming a first epitaxial layer and a first silicon-containing layer on the substrate, the first epitaxial layer and the first silicon-containing layer comprising carbon and a first concentration of phosphorus;
    forming a second epitaxial layer over the first epitaxial layer and forming a second silicon-containing layer over the first silicon-containing layer, wherein the second epitaxial layer and the second silicon-containing layer are formed simultaneously, and each of the second epitaxial layer and the second silicon-containing layer comprises carbon and a second concentration of phosphorus less than the first concentration of phosphorus; and
    exposing the substrate to an etchant to completely remove the second epitaxial layer, the first silicon-containing layer, and the second silicon-containing layer.

2. The method of claim 1, wherein the first epitaxial layer and the second epitaxial layer comprise silicon.

3. The method of claim 2, wherein the first silicon-containing layer and the second silicon-containing layer comprise amorphous silicon.

4. The method of claim 3, wherein the etchant comprises chlorine.

5. The method of claim 4, wherein the substrate is a monocrystalline substrate.

6. The method of claim 5, wherein the carbon present within the first epitaxial layer is within a range of about 0.2 atomic percent to about 0.3 atomic percent.

7. A method of forming a layer on a substrate, comprising:
    forming a first epitaxial layer and a first silicon-containing layer on the substrate, the first epitaxial layer and the first silicon-containing layer comprising carbon and a first phosphorus concentration of about $1 \times 10^{19}$ atoms per cubic centimeter to about $2.5 \times 10^{21}$ atoms per cubic centimeter;
    forming a second epitaxial layer over the first epitaxial layer and forming a second silicon-containing layer over the first silicon-containing layer, wherein the second epitaxial layer and the second silicon-containing layer are formed simultaneously, and each of the second epitaxial layer and the second silicon-containing layer comprises carbon and a second concentration of phosphorus less than the first phosphorus concentration; and
    exposing the substrate to an etchant to selectively remove the second epitaxial layer, the first silicon-containing layer, and the second silicon-containing layer, wherein the second epitaxial layer, the first silicon-containing layer, and the second silicon-containing layer are completely removed.

8. The method of claim 7, wherein the first epitaxial layer and the first silicon-containing layer each has a carbon concentration less than about 0.5 atomic percent.

9. The method of claim 8, wherein the first epitaxial layer and the first silicon-containing layer each has a carbon concentration between about 0.1 atomic percent and about 0.3 atomic percent.

10. The method of claim 7, further comprising heating the substrate to a temperature within a range of about 500 degrees Celsius to about 750 degrees Celsius prior to forming the first epitaxial layer.

11. The method of claim 7, wherein the first epitaxial layer and the first silicon-containing layer are deposited to a thickness within a range from about 20 angstroms to about 200 angstroms.

12. The method of claim 7, wherein the second epitaxial layer and the second silicon-containing layer are deposited using the same precursor gases as are used to deposit the first epitaxial layer and the first silicon-containing layer.

13. The method of claim 7, wherein the etchant is selected from the group consisting of HCl, HF, HBr, $CCl_4$, and $Cl_2$.

14. The method of claim 13, wherein the substrate is a monocrystalline substrate.

15. The method of claim 7, wherein the first epitaxial layer and the second epitaxial layer comprise silicon.

\* \* \* \* \*

UNITED STATES PATENT AND TRADEMARK OFFICE
CERTIFICATE OF CORRECTION

PATENT NO. : 9,012,328 B2
APPLICATION NO. : 13/193566
DATED : April 21, 2015
INVENTOR(S) : Ye et al.

Page 1 of 1

It is certified that error appears in the above-identified patent and that said Letters Patent is hereby corrected as shown below:

In the Claims:

Column 9, Claim 11, Line 17, please delete "20angstroms" and insert -- 20 angstroms -- therefor.

Signed and Sealed this
Thirteenth Day of October, 2015

Michelle K. Lee
*Director of the United States Patent and Trademark Office*